United States Patent
Chang et al.

(12)

(10) Patent No.: US 8,589,830 B2
(45) Date of Patent: Nov. 19, 2013

(54) METHOD AND APPARATUS FOR ENHANCED OPTICAL PROXIMITY CORRECTION

(75) Inventors: Chia-Cheng Chang, Chiayi (TW);
Chin-Min Huang, Taichung (TW);
Wei-Kuan Yu, Hsinchu (TW);
Cherng-Shyan Tsay, Toufen Township, Miaoli County (TW); Lai Chien Wen, Hsinchu (TW); Hua-Tai Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/414,183

(22) Filed: Mar. 7, 2012

(65) Prior Publication Data

US 2013/0239071 A1    Sep. 12, 2013

(51) Int. Cl.
*G06F 17/50* (2006.01)
*G06F 19/00* (2011.01)
*G21K 5/00* (2006.01)
*G03F 1/00* (2012.01)
*G03F 1/36* (2012.01)

(52) U.S. Cl.
CPC ............ *G06F 17/5081* (2013.01); *G06F 19/00* (2013.01); *G21K 5/00* (2013.01); *G03F 1/36* (2013.01); *G03F 1/0092* (2013.01); *G03F 1/02* (2013.01)
USPC ................. 716/53; 716/54; 716/55; 716/111; 716/136; 703/16; 700/110; 700/120; 700/121; 430/5; 378/35; 382/154; 382/144; 382/145

(58) Field of Classification Search
CPC ........ G06F 17/5081; G06K 9/00; G21K 5/00; G03F 1/36; G03F 1/0092; G03F 1/02
USPC ................... 716/43, 45, 55, 111, 136, 53, 54; 703/16; 700/110, 120, 121; 430/5; 378/35; 382/154, 144, 145
See application file for complete search history.

(56) References Cited

U.S. PATENT DOCUMENTS 6,544,699 B1    4/2003  Kim et al.
6,869,738 B2 *  3/2005  Oshima et al. .................. 430/30

(Continued)

OTHER PUBLICATIONS

Unpublished U.S. Appl. NO. 12/884,442, filed Sep. 17, 2010 entitled "Dissection Splitting With Optical Proximity Correction and Mask Rule Check Enforcement", 25 pages, now US Patent No. 8,381,153.

*Primary Examiner* — Phallaka Kik
(74) *Attorney, Agent, or Firm* — Haynes and Boone, LLP

(57) ABSTRACT

Provided is an integrated circuit (IC) design method. The method includes receiving an IC design layout having a feature with an outer boundary, performing a dissection on the feature to divide the outer boundary into a plurality of segments, and performing, using the segments, an optical proximity correction (OPC) on the feature to generate a modified outer boundary. The method also includes simulating a photolithography exposure of the feature with the modified outer boundary to create a contour and performing an OPC evaluation to determine if the contour is within a threshold. Additionally, the method includes repeating the performing a dissection, the performing an optical proximity correction, and the simulating if the contour does not meet the threshold, wherein each repeated dissection and each repeated optical proximity correction is performed on the modified outer boundary generated by the previously performed optical proximity correction.

20 Claims, 7 Drawing Sheets

(56) References Cited

U.S. PATENT DOCUMENTS

| | | | |
|---|---|---|---|
| 7,343,582 B2 * | 3/2008 | Mukherjee et al. | 716/53 |
| 7,398,508 B2 * | 7/2008 | Shi et al. | 716/52 |
| 7,493,587 B2 * | 2/2009 | Word | 716/50 |
| 7,802,225 B2 * | 9/2010 | Koike et al. | 716/106 |
| 8,131,075 B2 * | 3/2012 | Sun et al. | 382/173 |
| 2003/0162103 A1 * | 8/2003 | Oshima et al. | 430/5 |
| 2005/0081179 A1 | 4/2005 | Melvin, III | |
| 2005/0149902 A1 * | 7/2005 | Shi et al. | 716/21 |
| 2006/0199084 A1 * | 9/2006 | Word | 430/5 |
| 2006/0271905 A1 * | 11/2006 | Mukherjee et al. | 716/21 |
| 2008/0263483 A1 * | 10/2008 | Koike et al. | 716/5 |
| 2011/0271239 A1 | 11/2011 | Lu et al. | |

\* cited by examiner

METHOD AND APPARATUS FOR ENHANCED OPTICAL PROXIMITY CORRECTION

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as IC technologies are continually progressing to smaller technology nodes, such as 65 nm technology node, 45 nm technology node, and below, simply scaling down similar designs used at larger feature sizes often results in poorly shaped device features. Rounded corners on a device feature that is designed to have right-angle corners may prevent the device from performing as desired. Other examples of inaccurate feature formation include pinching, necking, bridging, dishing, erosion, metal line thickness variations, and other characteristics that affect device performance. Typically, optical proximity correction (OPC) may be performed on a design pattern before the pattern is created on a mask. However, current OPC techniques may not offer great enough fidelity to correct problems in sub-45 nm designs. Therefore, existing methods for improving IC manufacturing have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
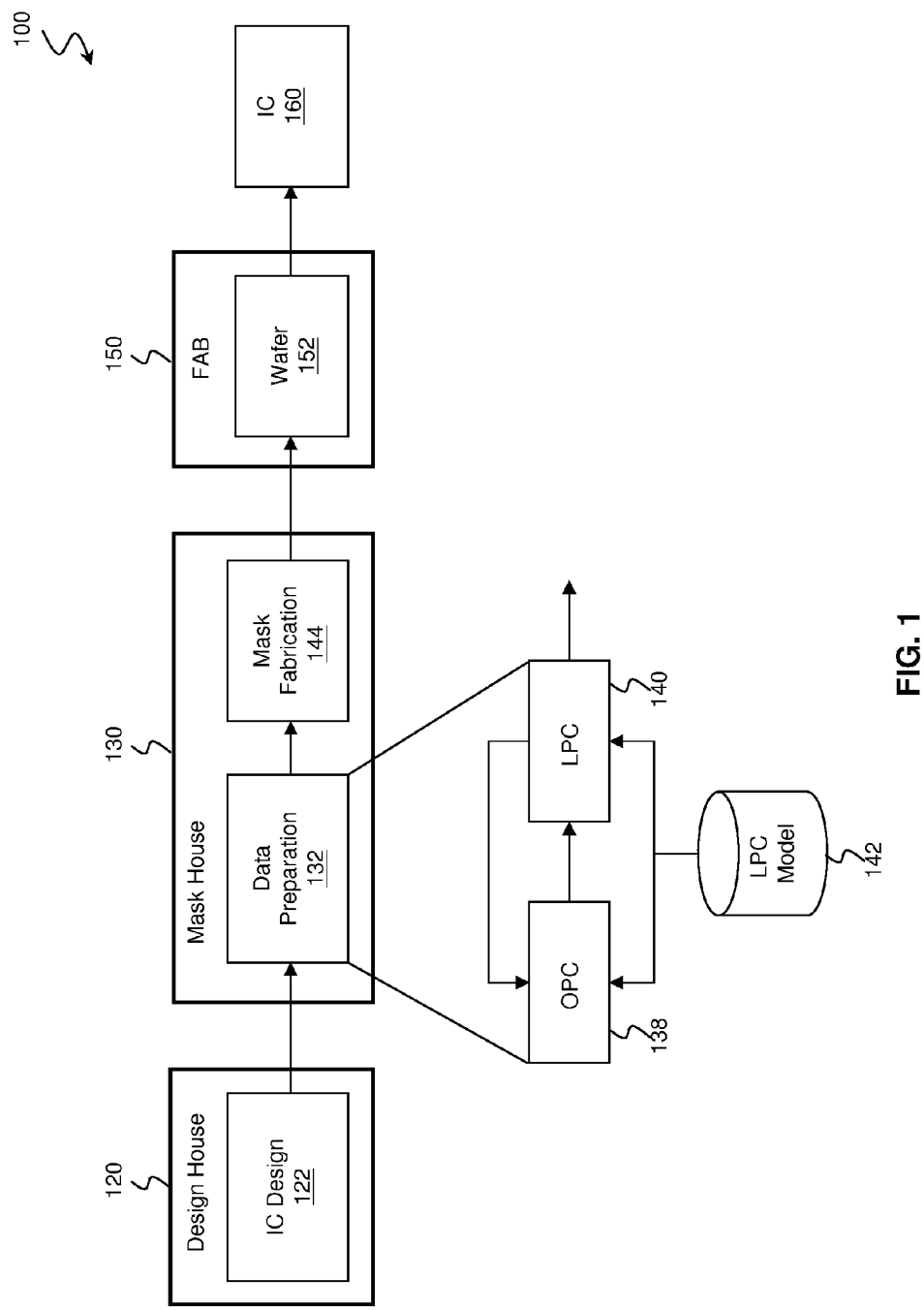
FIG. 1 is a simplified block diagram of an embodiment of an integrated circuit (IC) manufacturing system and an associated IC manufacturing flow.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a simplified block diagram of an embodiment of an integrated circuit (IC) manufacturing system 100 and an IC manufacturing flow associated with the IC manufacturing system. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. The design house 120, mask house 130, and IC manufacturer 150 may be a single entity or separate entities.

The design house (or design team) 120 generates an IC design layout 122. The IC design layout 122 includes various geometrical patterns designed for an IC product, based on a specification of the IC product to be manufactured. The geometrical patterns correspond to patterns of metal, oxide, or semiconductor layers that make up the various components of the IC device 160 to be fabricated. The various layers combine to form various IC features. For example, a portion of the IC design layout 122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format (or DFII file format).

The mask house 130 uses the IC design layout 122 to manufacture one or more masks to be used for fabricating the various layers of the IC product according to the IC design layout 122. The mask house 130 performs mask data preparation 132, where the IC design layout 122 is translated into a form that can be physically written by a mask writer, and mask fabrication 144, where the design layout prepared by the mask data preparation 132 is modified to comply with a particular mask writer and/or mask manufacturer and is then fabricated. In the present embodiment, the mask data preparation 132 and mask fabrication 144 are illustrated as separate elements, however, the mask data preparation 132 and mask fabrication 144 can be collectively referred to as mask data preparation.

The mask data preparation 132 includes an optical proximity correction (OPC) 138, and a lithography process check (LPC) 140. OPC 138 is a lithography enhancement technique used to compensate for image errors, such as those that can arise from diffraction, interference, or other process effects. OPC 138 may add features, such as scattering bars, serif, and/or hammerheads to the IC design layout 122 according to optical models or rules such that, after a lithography process, a final pattern on a wafer is improved with enhanced resolution and precision. Optical proximity checking according to the illustrated embodiment will be described in greater detail below. The mask data preparation 132 can include further resolution enhancement techniques, such as off-axis illumination, sub-resolution assist features, phase-shifting masks, other suitable techniques, or combinations thereof.

LPC 140 simulates processing that will be implemented by the IC manufacturer 150 to fabricate the IC device 160. LPC 140 simulates this processing based on the IC design layout 122 to create a simulated manufactured device, such as the IC device 160. The simulated manufactured device includes simulated contours of all or a portion of the IC design layout. In the present embodiment, the LPC 140 simulates processing of the modified IC design layout, which has been subjected to the OPC 138. Accordingly, the modified IC design layout is also referred to as the OPCed IC design layout. LPC 140 uses one or more LPC models (or rules) 142. The LPC models (or rules) 142 may be based on actual processing parameters of the IC manufacturer 150. The processing parameters can include parameters associated with various processes of the IC manufacturing cycle, parameters associated with tools used for manufacturing the IC, and/or other aspects of the manufacturing process. LPC 140 takes into account various factors, such as aerial image contrast, depth of focus ("DOF"), mask error sensitivity ("MEEF"), other suitable factors, or combinations thereof.

After a simulated manufactured device has been created by LPC 140, if the simulated device is not close enough in shape to satisfy design rules, certain steps in the mask data preparation 132, such as OPC 138, may be repeated to refine the IC design layout 122 further. An example refinement process is described in association with FIGS. 3-7. It should be understood that the above description of the mask data preparation 132 has been simplified for the purposes of clarity, and data preparation may include additional features such as a logic operation (LOP) to modify the IC design layout according to manufacturing rules, a retarget process (RET) to modify the IC design layout to compensate for limitations in lithographic processes used by IC manufacturer 150, and a mask rule check (MRC) to modify the IC design layout to compensate for limitations during mask fabrication 144. Additionally, the processes applied to the IC design layout 122 during data preparation 132 may be executed in a variety of different orders.

After mask data preparation 132 and during mask fabrication 144, a mask or group of masks are fabricated based on the modified IC design layout. For example, an electron-beam (e-beam) or a mechanism of multiple e-beams is used to form a pattern on a mask (photomask or reticle) based on the modified IC design layout. The mask can be formed in various technologies. In one embodiment, the mask is formed using binary technology. In the present embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM as known in the art.

The IC manufacturer 150, such as a semiconductor foundry, uses the mask (or masks) fabricated by the mask house 130 to fabricate the IC device 160. The IC manufacturer 150 is a IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer is fabricated using the mask (or masks) to form the IC device 160. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, in a deposition process (e.g., chemical vapor deposition (CVD) or physical vapor deposition (PVD)) to form a thin film in various regions on the semiconductor wafer, and/ or other suitable processes.

Figure 2:
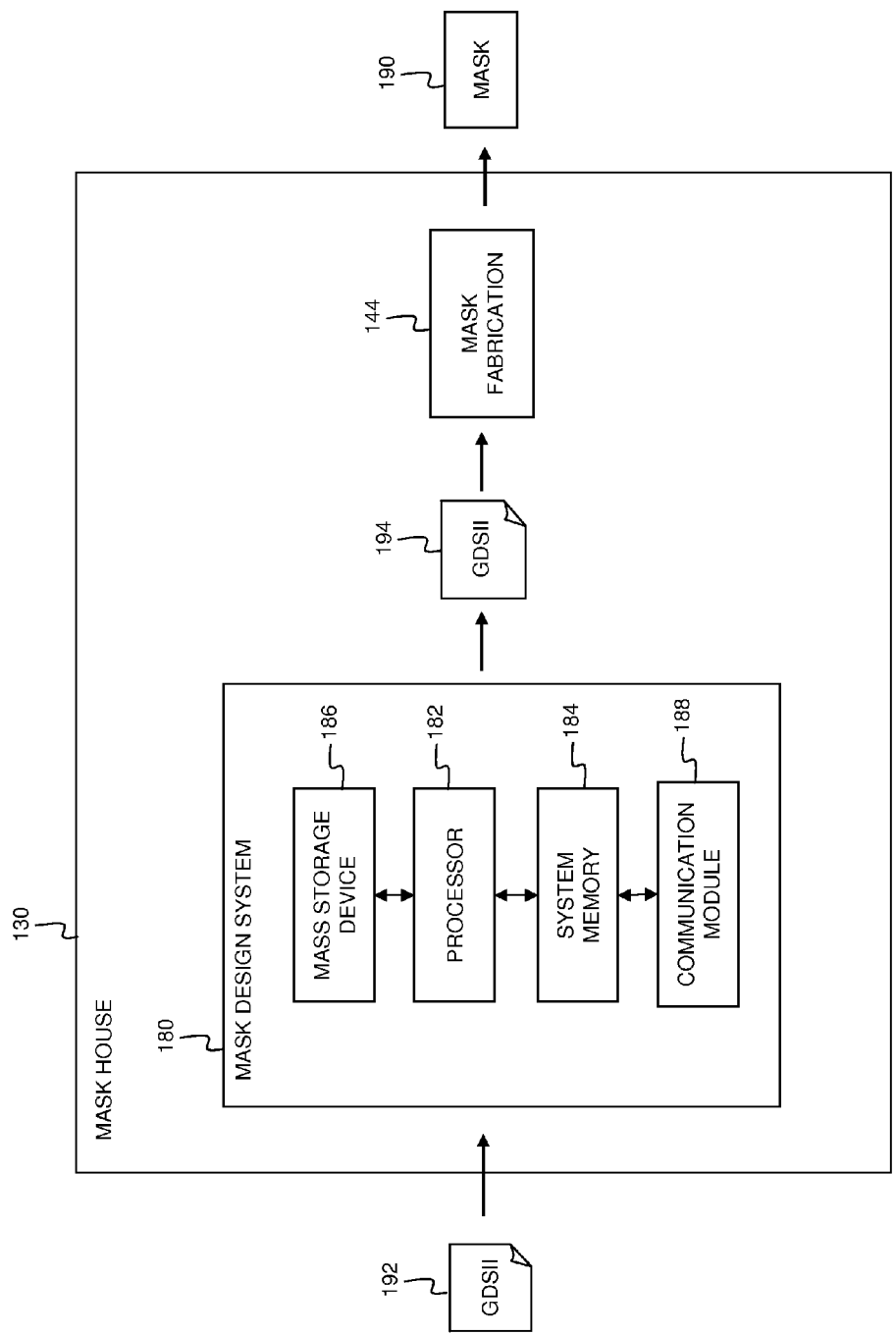
FIG. 2 is a more detailed block diagram of the mask house shown in FIG. 1 according to various aspects of the present disclosure.

FIG. 2 is a more detailed block diagram of the mask house 130 shown in FIG. 1 according to various aspects of the present disclosure. In the illustrated embodiment, the mask house 130 includes a mask design system 180 that is operable to perform the functionality described in association with mask data preparation 132 of FIG. 1. The mask design system 180 is an information handling system such as a computer, server, workstation, or other suitable device. The system 180 includes a processor 182 that is communicatively coupled to a system memory 184, a mass storage device 186, and a communication module 188. The system memory 184 provides the processor 182 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 186. Examples of mass storage devices may include hard discs, optical disks, magneto-optical discs, solid-state storage devices, and/or a variety other mass storage devices known in the art. The communication module 188 is operable to communicate information such as IC design layout files with the other components in the IC manufacturing system 100, such as design house 120. Examples of communication modules may include Ethernet cards, 802.11 WiFi devices, cellular data radios, and/or other suitable devices known in the art.

In operation, the mask design system 180 is configured to manipulate the IC design layout 122 according to a variety of design rules and limitations before it is transferred to a mask 190 by mask fabrication 144. For example, in one embodiment, OPC 138 and LPC 140 may be implemented as software instructions executing on the mask design system 180. In such an embodiment, the mask design system 180 receives a first GDSII file 192 containing the IC design layout 122 from the design house 120. After the mask data preparation 132 is complete, the mask design system 180 transmits a second GDSII file 194 containing the a modified IC design layout to mask fabrication 144. In alternative embodiments, the IC design layout may be transmitted between the components in IC manufacturing system 100 in alternate file formats such as DFII, CIF, OASIS, or any other suitable file type. Further, the mask design system 180 and the mask house 130 may include additional and/or different components in alternative embodiments.

Figure 3:
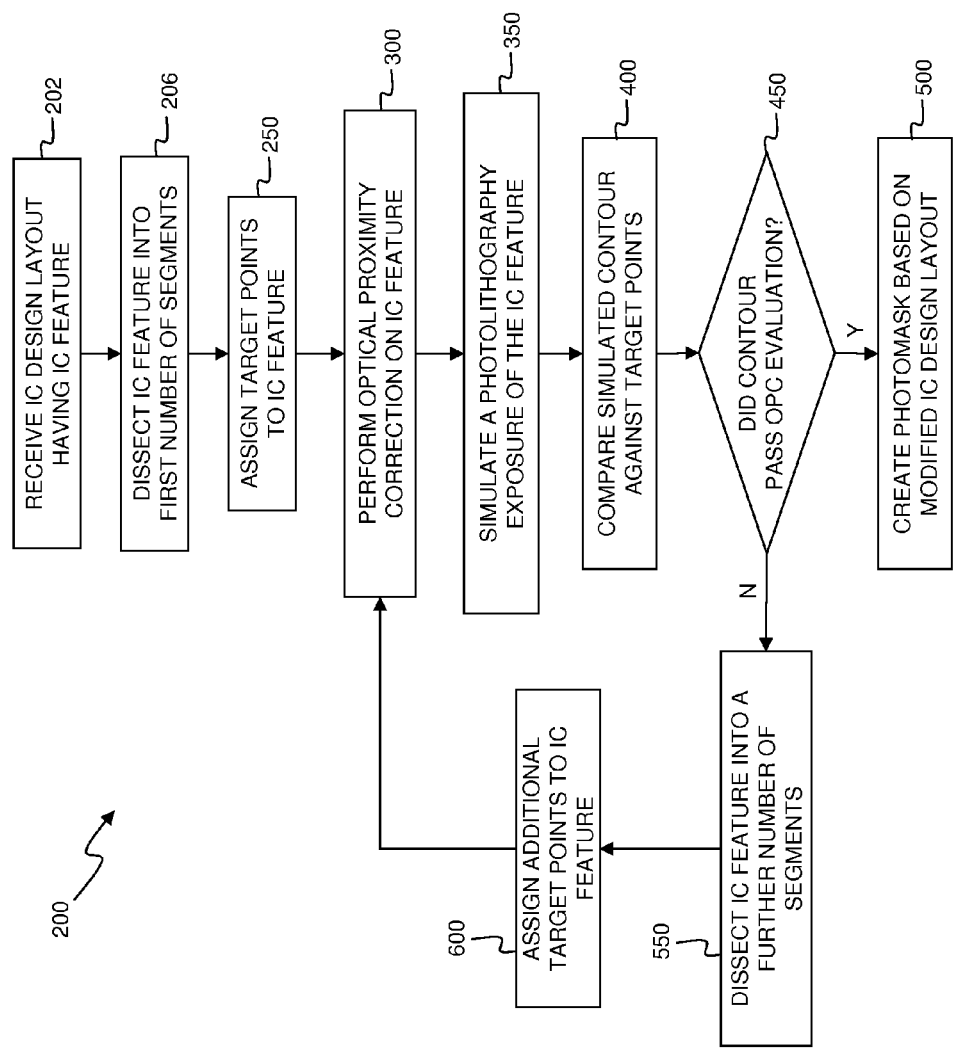
FIG. 3 is a high-level flowchart of a method of modifying an IC design layout before mask fabrication according to various aspects of the present disclosure.

FIG. 3 is a high-level flowchart of a method 200 of modifying an IC design layout before mask fabrication according to various aspects of the present disclosure. In one embodiment, the method 200 may be implemented in the mask data preparation 132 of mask house 130 shown in FIG. 1. Further, the method 200 in FIG. 3 is a high-level overview and details associated with each block in the method will be described in association with the subsequent figures in the present disclosure.

The method 200 begins at block 202 where the mask house 130 receives the IC design layout 122. The IC design layout 122 includes various geometrical patterns representing features of an integrated circuit. For example, the IC design layout 22 may includes main IC features such as active regions, gate electrodes, sources and drains, metal lines, interlayer interconnection vias, and openings for bonding pads that may be formed in a semiconductor substrate (such as a silicon wafer) and various material layers disposed over the semiconductor substrate. The IC design layout 22 may also include certain assist features, such as those features for imaging effect, processing enhancement, and/or mask identification information. In this regard, FIG. 3 illustrates an example IC feature 204 that is a feature contained in the IC design layout 122. In the illustrated embodiment, the feature 204 is a gate electrode, but, in alternative embodiments, it may be a contact feature or any other IC feature. The feature 204 includes an original outer boundary 206 that defines the shape of the feature 204. Ideally, when the feature 204 is formed on the integrated circuit 160, it will maintain the same shape as defined by the original outer boundary 206, but this is not always so.

Figure 4:
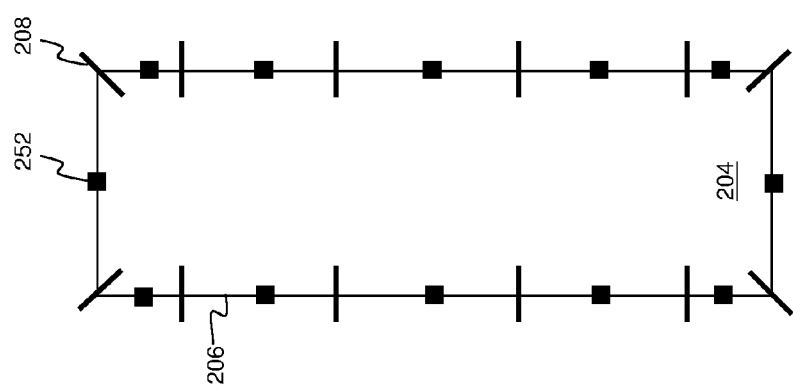
FIG. 4 is an example dissection performed on an IC feature.

The method 200 next proceeds to block 206 where a dissection is performed on the IC feature 204. Specifically, as shown in FIG. 4, the original outer boundary 206 is dissected into multiple discrete segments by a plurality of dissection points (or stitching points) 208. A segment is a portion of the outer boundary 206 defined by two adjacent dissection points 208. In the illustrated embodiment, the boundary 206 is divided into 12 discrete segments. Next, in block 250, target points are assigned to the IC feature 204. Specifically, one or more target points 252 are assigned to spaced locations around the outer boundary 206. In the illustrated embodiment, 12 target points have been assigned to the feature 204. The target points 204 are utilized in conjunction with the photolithography simulation of the feature 204 during LPC 140. Specifically, the target points are used to determine if the contours of the simulated feature match the original outer boundary 206. In alternative embodiments, the feature 204 may be dissected in a different manner to produce a different number of segments. Further, a greater or fewer number of target points may be assigned to the outer boundary 206 depending on an error tolerance of the final integrated circuit. Further, as shown in FIG. 4, each segment is associated with a single target point. In other embodiments, this may not hold true.

Figure 5:
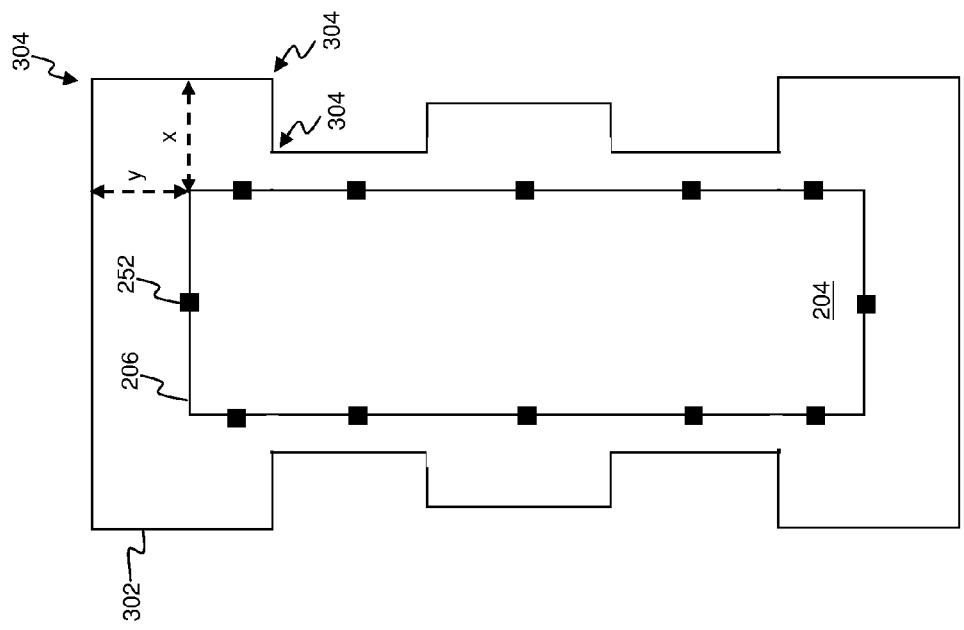
FIG. 5 is an example of an IC feature after it has undergone optical proximity correction.

After the IC feature 204 has been dissected and target points have been assigned, the method 200 proceeds to block 300 where an optical proximity correction, such as OPC 138, is performed on the IC design layout 122. In general, OPC is utilized to modify the shape of an IC feature to compensate for diffraction or other process effects so that the shape of the feature as formed in the final integrated circuit closely matches the shape of the feature in the IC design layout. In the illustrated embodiment, OPC 138 includes altering the shape of the outer boundary 206 by shifting the relative positions of the segments that make up the boundary. In that regard, FIG. 5 is an example of the IC design layout 122 after it has undergone optical proximity correction. FIG. 5 shows the original outer boundary 206 as well as a modified outer boundary 302. As mentioned above, the modified outer boundary 302 of the IC feature 204 is formed by independently shifting the positions of the IC feature's segments. For example, the segments that form the upper right-hand corner of the IC feature 204 have been respectively moved outwardly by a distance x and a distance y. The segments now converge at a vertex 304. And, the modified boundary 302 includes a total of three vertices 304 that define the upper right-hand corner of the IC feature 204. In alternative embodiments, optical proximity correction may add various assist features, such as scattering bars, serifs or hammerheads to the IC feature 204. The assist features may be placed a distance away from the main feature (such as scattering bars) or be placed adjacent to the main feature (such as serifs and hammerheads). Further, additional features may be added to the IC design layout 122. For example, dummy insertion features may be added for enhanced chemical mechanical polishing (CMP) or other processing advantages.

Figure 6:
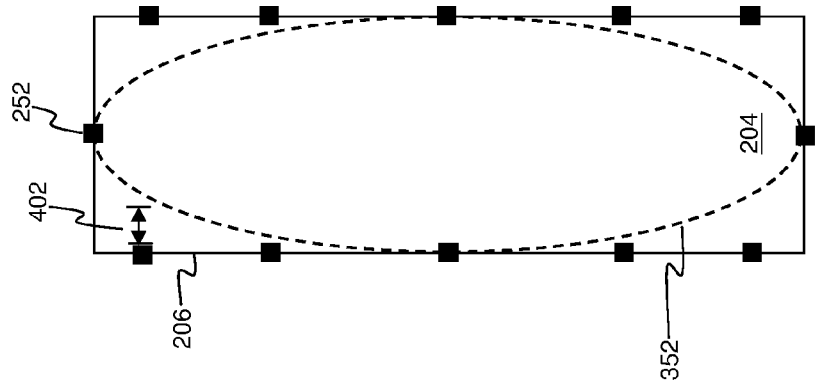
FIG. 6 illustrates an example contour that results from a photolithography simulation of an IC feature.

After optical proximity correction has been performed on the IC design layout 122, the method 200 proceeds to block 350 where a photolithography simulation, such as LPC 140 is performed on the layout. Specifically, in this block, is it determined what shape a hypothetical photomask having a feature with the modified outer boundary 302 would produce on a wafer if the photomask was exposed by a photolithography tool described by the LPC model 142. The simulated shape is called a contour. In that regard, FIG. 6 illustrates an example contour 352 that results from the photolithography simulation performed in block 350.

Next, method 200 moves to block 400 where the contour 352 is compared to the original outer boundary 206 of the IC feature 204 (sometimes called an OPC evaluation). Specifically, it is determined whether the contour 352 meets or overlaps the target points 252 located along the original outer boundary 206. As shown in FIG. 6, the example contour includes substantially rounded-off corners and thus fails to meet most of the target points 252. In some embodiments, whether a contour passes an OPC evaluation is determined by the closeness of the contour to the target points of the original boundary—specifically, whether the contour falls within a threshold distance 402 that defines an allowable distance away from a target point. In other words, if the contour meets the threshold, it is "close enough" to the target points and it passes the OPC evaluation. In the illustrated example, the contour 352 failed the OPC evaluation because it did not meet the threshold distance 402. In alternative embodiments, the simulation and OPC evaluation may be performed in alternative manners depending on the fidelity of the final IC desired.

Figure 7:
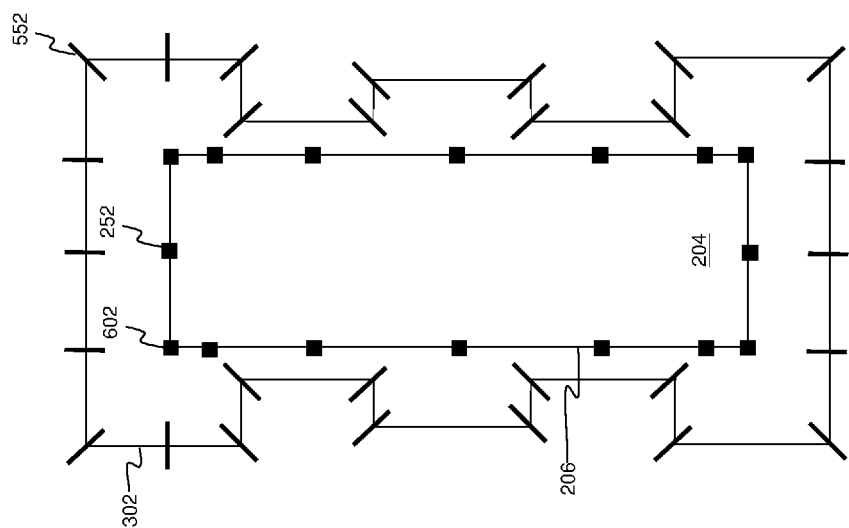
FIG. 7 is an illustration of an IC feature after a further dissection has been performed.

Referring back to FIG. 3, in decision block 450 it is determined whether the contour 352 produced by the simulation of block 350 passed the OPC evaluation of block 400. If it did (i.e., the contour met or overlapped most or all of the target points on the original outer boundary), then the method 200 finishes at block 500 where the IC design layout having the modified IC feature 204 is saved to the GDSII file 194 and transferred to mask fabrication 144, where the IC design layout is formed on the photomask 190. If the contour produced by the simulation did not pass the OPC evaluation—as is the case in the illustrated example—the method 200 proceeds instead to block 550, where the OPC steps described above are begun again to enhance the fidelity of the contour. Specifically, in block 550, a second dissection is performed on the IC feature 204. In that regard, FIG. 7 is an illustration of the IC feature 204 after a further dissection is performed. In more detail, during the second dissection procedure, the modified boundary 302 is dissected into multiple discrete segments by a plurality of dissection points 552. In the illustrated embodiment, the number of dissection points, and thus the number of segments, applied to the modified outer boundary 302 is greater than the number of dissection points 208 applied to the original outer boundary 208 during the first dissection, as shown in FIG. 4. Specifically, 28 dissection points are applied to the modified outer boundary 302 to create 28 segments. In alternative embodiments, a greater or fewer number of dissection points may be applied. For instance, if the contour 352 shown in FIG. 6 was substantially close to most of the target points during the evaluation in block 400, fewer additional dissection points may be needed. But, if the contour 352 was far off from the desired shape of the original outer boundary 206, then a greater number of additional dissection points may be needed to increase the fidelity of the contour.

After the second dissection is performed on the modified outer boundary 302, the method 200 proceeds to block 600, where additional target points are assigned to the original outer boundary 206 of the IC feature 204. In the illustrated embodiment of FIG. 7, four additional target points 602 are applied to the corners of the original outer boundary 206. The number of additional target points applied to the outer boundary 206 may depend on the desired level of fidelity required for the simulated contour, which translates into how close in shape the IC feature formed in the final integrated circuit is to the shape of the IC feature in the original IC design layout. Thus, in alternative embodiments, a greater or fewer number of additional target points may be applied to the outer IC feature, and the number of additional target points may or may not correspond to the number of additional dissection points added to the modified outer boundary over the original outer boundary.

Figure 8:
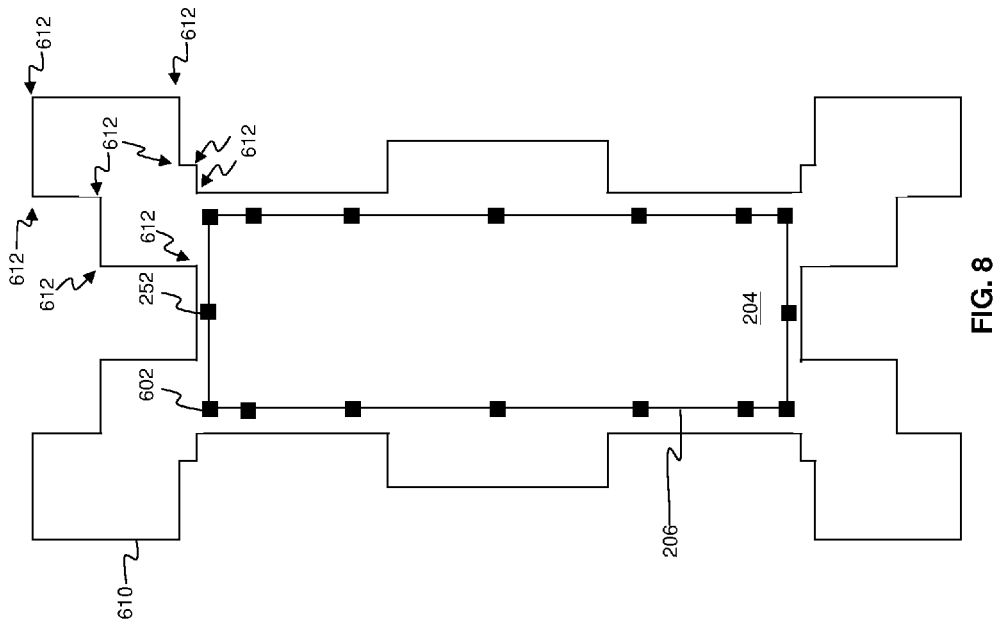
FIG. 8 is an example of an IC feature after it has undergone a further optical proximity correction.

After additional target points are assigned in block 600, the method 200 returns to block 300 where an additional optical proximity correction is performed on the IC design layout. Specifically, the OPC is performed in the same manner as previously performed in block 300, however, it is performed on the modified outer boundary 302 rather than the original outer boundary 206. That is, the second pass of OPC 138 includes altering the shape of the modified outer boundary 302 by shifting the relative positions of the segments that make up the modified boundary. In that regard, FIG. 8 is an example of the IC feature 204 after it has undergone a further optical proximity correction to generate a further modified outer boundary 610. The original outer boundary 206 is shown as a reference. Because the modified outer boundary 302 was dissected into a greater number of segments than the original outer boundary 206, the OPC process was able to create a more complex shape for the further modified outer boundary 610. For instance, in the upper right-hand corner of the IC feature 204, the further modified outer boundary 610 includes nine vertices 612, whereas the modified outer boundary 302 only included three vertices. The greater number of segments, and thus greater number of vertices, allows the OPC process to have a higher degree of freedom in correcting the shape of the IC feature 204 when it is formed on a integrated circuit.

Figure 10:
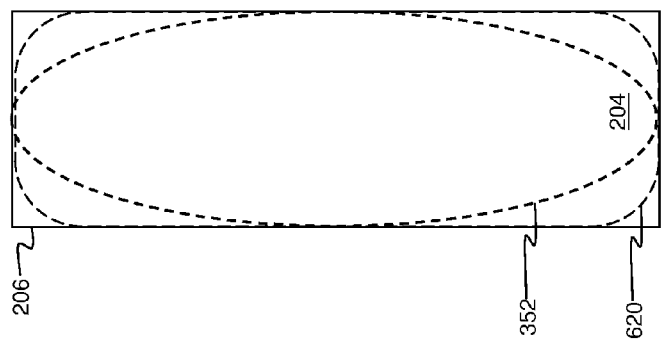
FIG. 10 illustrates a difference between two different example contours generated from two photolithography simulations.
Figure 9:
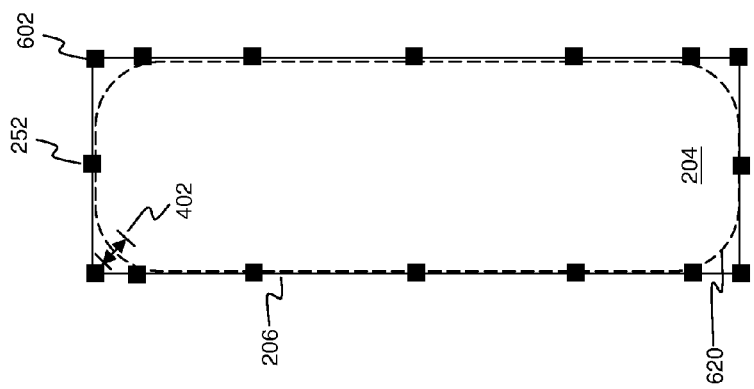
FIG. 9 illustrates an example contour that results from a further photolithography simulation.

After a second optical proximity correction has been performed in block 300, the method again proceeds to block 350 where the IC design layout 122 is again simulated by LPC 140. Specifically, in this block, is it determined what shape a hypothetical photomask having a feature with the further modified outer boundary 610 would produce on a wafer if the photomask was exposed by a photolithography tool described by the LPC model 142. In that regard, FIG. 9 illustrates an example contour 620 that results from the second photolithography simulation performed in block 350. Next, the method 200 continues to block 400 again where the contour 620 is compared against the original outer boundary 206 (i.e., an OPC evaluation). Specifically, it is determined whether the contour 620 overlaps or nearly overlaps the target points 252 and the additional target points 602. As shown in the illustrated example of FIG. 9, the contour 620 intersects almost all of the target points, and thus is substantially the same shape as the original outer boundary 206. The corners of the contour 620 are slightly rounded, but the contour is within the threshold distance 402, and thus it passes the OPC evaluation. In other words, the degree of roundness exhibited by the corners of the contour 620 may be within a tolerance level required for correct operation of the final integrated circuit 160. Thus, as shown by the similarity of the contour 620 to the original outer boundary 206, the further modified outer boundary 610 generated by the second dissection (block 550) and second OPC process (block 300) allows for a higher fidelity IC feature to be formed in the integrated circuit 160 than by a single-pass OPC process. For example, as shown in FIG. 10, the contour 352—generated by the first OPC and simulation—is an oval shape with substantially rounded corners that does not closely approximate the original outer boundary 206. However, the contour 620—generated by the second dissection, second OPC, and second simulation—closely approximates the original outer boundary 206.

Referring back to FIG. 3, in decision block 450 it is determined whether the contour produced by the simulation of block 350 passed the OPC evaluation of block 400. If it did, as in the illustrated example of FIG. 9, then the method 200 finishes at block 500 where the IC design layout with the modified IC feature 204 (having the further modified outer boundary 610) is saved to the GDSII file 194 and transferred to mask fabrication 144, where the IC design layout is formed on the photomask 190. If the contour produced by the simulation did not pass the OPC evaluation (for instance if the threshold distance is smaller than shown), the method 200 would return to block 550 and perform a third dissection, this time on the further modified outer boundary 610. In this manner, the OPC 138 may produce an aggressive dimension on mask (DOM) design to be formed on a photomask.

It is understood that method of modifying an IC design layout before mask fabrication of the illustrated embodiment is simply an example and in alternative embodiments, additional and/or different steps may be included in the method. Further, the IC feature illustrated herein may be substituted for any number of different IC features, and the blocks of method 200 may be applied to the different IC features in a similar manner.

Further, method 200 of modifying an IC design layout before mask fabrication of the illustrated embodiment is designed to be executed on any computing architecture, such as the mask design system 180 described in association with FIG. 2. For example, the method 200 may be executed on a single computer, local area networks, client-server networks, wide area networks, internets, hand-held and other portable and wireless devices and networks. Such architecture can take the form of an entirely hardware embodiment, an entirely software embodiment, or an embodiment containing both hardware and software elements. Hardware generally includes at least processor-capable platforms, such as client-machines (also known as personal computers or servers), and hand-held processing devices (such as smart phones, personal digital assistants (PDAs), or personal computing devices (PCDs), for example. Hardware can include any physical device that is capable of storing machine-readable instructions, such as memory or other data storage devices. Other forms of hardware include hardware sub-systems, including transfer devices such as modems, modem cards, ports, and port cards, for example. Software generally includes any machine code stored in any memory medium, such as RAM or ROM, and machine code stored on other devices (such as floppy disks, flash memory, or a CDROM, for example). Software can include source or object code, for example. In addition, software encompasses any set of instructions capable of being executed in a client machine or server.

Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to an integrated circuit (IC) design method. The method includes receiving an IC design layout having a feature with an outer boundary, performing a dissection on the feature to divide the outer boundary into a plurality of segments, and performing, using the segments, an optical proximity correction (OPC) on the feature to generate a modified outer boundary. The method also includes simulating a photolithography exposure of the feature with the modified outer boundary to create a contour and performing an OPC evaluation to determine if the contour is within a threshold. Additionally, the method includes repeating the performing a dissection, the performing an optical proximity correction, and the simulating if the contour does not meet the threshold, wherein each repeated dissection and each repeated optical proximity correction is performed on the modified outer boundary generated by the previously performed optical proximity correction.

In another exemplary aspect, the present disclosure is directed to an integrated circuit (IC) design method. The method includes receiving an IC design layout having a feature with an outer boundary, performing a first dissection on the feature to divide the outer boundary into a first number of segments, and performing a first optical proximity correction on the feature to independently adjust one or more of the segments to form a modified outer boundary. The method also includes simulating a photolithography exposure of the IC design layout to generate a first contour and comparing the first contour to the outer boundary of the feature to determine if the first contour is within a threshold distance to the outer boundary. If the first contour does not meet the threshold, the method includes performing a second dissection on the feature to divide the modified outer boundary into a second number of segments greater than the first number of segments and performing a second optical proximity correction on the feature to independently adjust one or more of the segments of the modified outer boundary to form a further modified outer boundary.

In a further exemplary aspect, the present disclosure is directed to an integrated circuit (IC) design system. The system includes a processor and a communication module communicatively coupled to the processor and configured to receive an IC design layout having a feature with an outer boundary. The system also includes non-transitory, computer-readable storage communicatively coupled to the processor and including instructions executable by the processor. The instructions include: instructions to perform a dissection on the feature to divide the outer boundary into a plurality of segments and instructions to perform, using the segments, an optical proximity correction (OPC) on the feature to generate a modified outer boundary. The instructions also include instructions to simulate a photolithography exposure of the feature with the modified outer boundary to create a contour and instructions to perform an OPC evaluation to determine if the contour is within a threshold. Additionally, the instructions include instructions to repeat the instructions to perform a dissection, the instructions to perform an optical proximity correction, and the instructions to simulate if the contour does not meet the threshold, wherein each repeated dissection and each repeated optical proximity correction is performed on the modified outer boundary generated by the previously performed optical proximity correction.

What is claimed is:
1. An integrated circuit (IC) design method, comprising:
   receiving an IC design layout having a feature with an outer boundary;
   performing a dissection on the feature to divide the outer boundary into a plurality of segments;

performing, using the segments, an optical proximity correction (OPC) on the feature to generate a modified outer boundary;

simulating, using a processor, a photolithography exposure of the feature with the modified outer boundary to create a contour;

performing an OPC evaluation to determine if the contour is within a threshold; and repeating the performing the dissection, the performing the optical proximity correction, and the simulating if the contour does not meet the threshold, wherein each repeated dissection and each repeated optical proximity correction is performed on the modified outer boundary generated by the previously performed optical proximity correction.

2. The IC design method of claim 1, wherein the repeating the performing the dissection includes dividing the modified outer boundary into a plurality of segments greater in number than the plurality of segments created by the previous dissection.

3. The IC design method of claim 2, wherein the repeating the performing the optical proximity correction further modifies the modified outer boundary using the plurality of segments greater in number than the plurality of segments created by the previous dissection.

4. The IC design method of claim 3, wherein the further modified outer boundary includes a greater number of vertices than the modified outer boundary.

5. The IC design method of claim 1, wherein the repeating the simulating includes simulating, to create a further contour, a photolithography exposure of the feature with the modified outer boundary that is further modified by the repeated optical proximity correction.

6. The IC design method of claim 5, further including repeating the performing the optical proximity correction evaluation if the contour does not meet the threshold, the repeating the performing the optical proximity correction evaluation including determining if the further contour created by the repeated simulating is within the threshold.

7. The IC design method of claim 1, wherein the performing the dissection includes assigning a plurality of target points to the outer boundary of the feature.

8. The IC design method of claim 7, wherein the repeating the performing the dissection includes assigning additional target points to the outer boundary of the feature.

9. The IC design method of claim 7, wherein the threshold is defined as a distance away from a target point.

10. The IC design method of claim 1, further including forming the feature having the modified outer boundary on a photomask if the contour meets the threshold.

11. An integrated circuit (IC) design method comprising:

receiving an IC design layout having a feature with an outer boundary;

performing a first dissection on the feature to divide the outer boundary into a first number of segments;

performing a first optical proximity correction on the feature to independently adjust one or more of the segments to form a modified outer boundary;

simulating, using a processor, a photolithography exposure of the IC design layout to generate a first contour;

comparing the first contour to the outer boundary of the feature to determine if the first contour is within a threshold distance to the outer boundary; and if the first contour does not meet the threshold distance:
performing a second dissection on the feature to divide the modified outer boundary into a second number of segments greater than the first number of segments, and performing a second optical proximity correction on the feature to independently adjust one or more of the segments of the modified outer boundary to form a further modified outer boundary.

12. The IC design method of claim 11, further including simulating, if the first contour is not within the threshold distance, a photolithography exposure of the feature having the further modified outer boundary to generate a second contour.

13. The IC design method of claim 12, further including comparing the second contour to the outer boundary of the feature to determine if the second contour is within the threshold distance to the outer boundary.

14. The IC design method of claim 13, further including forming the feature having the further modified outer boundary on a photomask if the second contour is within the threshold distance.

15. The IC design method of claim 11, wherein the further modified outer boundary includes a greater number of vertices than the modified outer boundary.

16. The IC design method of claim 11, wherein the performing the first dissection includes assigning a plurality of target points to the outer boundary of the feature.

17. An integrated circuit (IC) design system, comprising:
a processor;
a communication module communicatively coupled to the processor and configured to receive an IC design layout having a feature with an outer boundary;
a non-transitory, computer-readable storage communicatively coupled to the processor and including instructions executable by the processor, the instructions including:
instructions to perform a dissection on the feature to divide the outer boundary into a plurality of segments;
instructions to perform, using the segments, an optical proximity correction on the feature to generate a modified outer boundary;
instructions to simulate a photolithography exposure of the feature with the modified outer boundary to create a contour;
instructions to perform an optical proximity correction evaluation to determine if the contour is within a threshold; and
instructions to repeat the instructions to perform the dissection, the instructions to perform the optical proximity correction, and the instructions to simulate if the contour does not meet the threshold, wherein each repeated dissection and each repeated optical proximity correction is performed on the modified outer boundary generated by the previously performed optical proximity correction.

18. The IC design system of claim 17, wherein the instructions to repeat the instructions to perform the dissection include instructions to divide the modified outer boundary into a plurality of segments greater in number than the plurality of segments created by the previous dissection.

19. The IC design system of claim 18, wherein the instructions to repeat the instructions to perform the optical proximity correction further modifies the modified outer boundary using the plurality of segments greater in number than the plurality of segments created by the previous dissection.

20. The IC design system of claim 17, wherein the instructions to repeat the instructions to simulate includes instructions to simulate a photolithography exposure of the feature with the modified outer boundary that is further modified by the repeated optical proximity correction to create a further contour.

* * * * *